United States Patent
Han et al.

(10) Patent No.: US 11,226,738 B2
(45) Date of Patent: Jan. 18, 2022

(54) ELECTRONIC DEVICE AND DATA COMPRESSION METHOD THEREOF

(71) Applicant: Samsung Electronics Co., Ltd., Suwon-si (KR)

(72) Inventors: Sangbok Han, Suwon-si (KR); Jinkyu Koo, Yongin-si (KR); Hyunsik Kim, Suwon-si (KR); Sunho Moon, Suwon-si (KR); Chungsuk Han, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/750,733

(22) PCT Filed: Aug. 4, 2016

(86) PCT No.: PCT/KR2016/008596
§ 371 (c)(1),
(2) Date: Feb. 6, 2018

(87) PCT Pub. No.: WO2017/026740
PCT Pub. Date: Feb. 16, 2017

(65) Prior Publication Data
US 2019/0004708 A1 Jan. 3, 2019

(30) Foreign Application Priority Data
Aug. 12, 2015 (KR) .................. 10-2015-0113935

(51) Int. Cl.
*G06F 3/06* (2006.01)
*H03M 7/30* (2006.01)
(Continued)

(52) U.S. Cl.
CPC .......... *G06F 3/0608* (2013.01); *G06F 3/0631* (2013.01); *G06F 3/0658* (2013.01);
(Continued)

(58) Field of Classification Search
CPC .... G06F 3/0608; G06F 3/0631; G06F 3/0658; G06F 3/0673; G06F 7/14; G06F 11/14;
(Continued)

(56) References Cited

U.S. PATENT DOCUMENTS

| 5,406,278 A | * | 4/1995 | Graybill ................. G06T 9/005 |
| | | | 341/106 |
| 6,226,411 B1 | | 5/2001 | Hiyoshi |

(Continued)

FOREIGN PATENT DOCUMENTS

| CN | 1365194 A | 8/2002 |
| CN | 1949670 A | 4/2007 |

(Continued)

OTHER PUBLICATIONS

Ziv, Jacob; Lempel, Abraham, A Universal Algorithm for Sequential Data Compression. IEEE Transactions on Information Theory, vol. IT-23, No. 3, May 1977.*

(Continued)

*Primary Examiner* — Michael Krofcheck
*Assistant Examiner* — John Francis Wojton
(74) *Attorney, Agent, or Firm* — Jefferson IP Law, LLP

(57) ABSTRACT

Disclosed are an electronic device and a data compression method thereof. According to a data compression method of an electronic device of the present invention, the method comprises the steps of: compressing a page; determining whether data included in the compressed page is stored in a memory; and merging the compressed page with data previously stored in the memory when a result of the determination shows that the data included in the compressed page is the same as the previously stored data. Therefore, the electronic device can prevent a page including the same or similar data from being stored a multiple number of times in a swap area, thereby raising memory securing efficiency.

9 Claims, 13 Drawing Sheets

(51) Int. Cl.
*G06F 11/14* (2006.01)
*G06F 12/02* (2006.01)
*G06F 7/14* (2006.01)

(52) U.S. Cl.
CPC .............. *G06F 3/0673* (2013.01); *G06F 7/14* (2013.01); *G06F 11/14* (2013.01); *G06F 12/0246* (2013.01); *H03M 7/30* (2013.01); *G06F 2212/401* (2013.01); *G06F 2212/7201* (2013.01)

(58) Field of Classification Search
CPC ........... G06F 12/0246; G06F 2212/401; G06F 2212/7201; H03M 7/30
USPC ......................................................... 711/154
See application file for complete search history.

(56) References Cited

U.S. PATENT DOCUMENTS

| | | | |
|---|---|---|---|
| 6,385,587 | B1 | 5/2002 | Heo |
| 6,879,266 | B1* | 4/2005 | Dye .................. G06F 12/08 341/51 |
| 2011/0307659 | A1* | 12/2011 | Hans ................. G06F 3/0613 711/114 |
| 2012/0016839 | A1 | 1/2012 | Yueh |
| 2012/0284587 | A1 | 11/2012 | Yu et al. |
| 2013/0060992 | A1 | 3/2013 | Cho et al. |
| 2015/0049097 | A1 | 2/2015 | Ju et al. |
| 2015/0067238 | A1 | 3/2015 | Marcu et al. |
| 2016/0117116 | A1* | 4/2016 | Lee .................... G06F 3/0638 711/104 |
| 2018/0285267 | A1* | 10/2018 | Sasanka .............. G06F 12/0607 |

FOREIGN PATENT DOCUMENTS

| | | |
|---|---|---|
| CN | 100517979 C | 7/2009 |
| CN | 103098016 A | 5/2013 |
| CN | 103744617 A | 4/2014 |
| CN | 104035822 A | 9/2014 |
| CN | 104199892 A | 12/2014 |
| CN | 104376830 A | 2/2015 |
| KR | 10-1331098 B1 | 11/2013 |
| WO | 2014/104509 A1 | 7/2014 |

OTHER PUBLICATIONS

Ziv, Jacob; Lempel, Abraham, A Universal Algorithm for Sequential Data Compression. IEEE Transactions on Information Theory, vol. IT-23, No. 3, May 1977 (Year: 1977).*

Yaqiong Li et al., "TMemCanal: A VM-oblivious Dynamic Memory Optimization Scheme for Virtual Machines in Cloud Computing", 2010 10th IEEE International Conference on Computer and Information Technology (CIT 2010).

Sangduck Park et al., "Compressed Swapping for NAND Flash Memory Based Embedded Systems", Embedded Computer Systems: Architectures, Modeling, and Simulation, LNCS vol. 3553, Proceedings of 5th International Workshop SAMOS 2005.

Computer Knowledge and Technology, "A Study on Content-Based Data De-duplication Technology", vol. 6, No. 22, pp. 6275-6277, Aug. 31, 2010.

Chinese Office Action dated Jun. 30, 2021, issued in Chinese Patent Application No. 201680047598.7.

Tanguilig III et al., Data Extraction using Preprocessing Compression Based on LZW to improve DB Performance, 2011 Ninth International Conference on Software Engineering Research, Management and Applications, Nov. 3, 2011.

Chinese Office Action dated Nov. 3, 2021, issued in Chinese Patent Application No. 201680047598.7.

* cited by examiner

FIG. 4

| PFN | Address | Index # |
|-----|---------|---------|
| 1 | 7EF61000 | 0000 |
| 2 | 7EF64000 | 0001 |
| 6 | 7EF67000 | 1010 |
| 7 | 7EF82000 | 1111 |
| 3 | 7EFDF000 | 1000 |
| ⋮ | ⋮ | ⋮ |

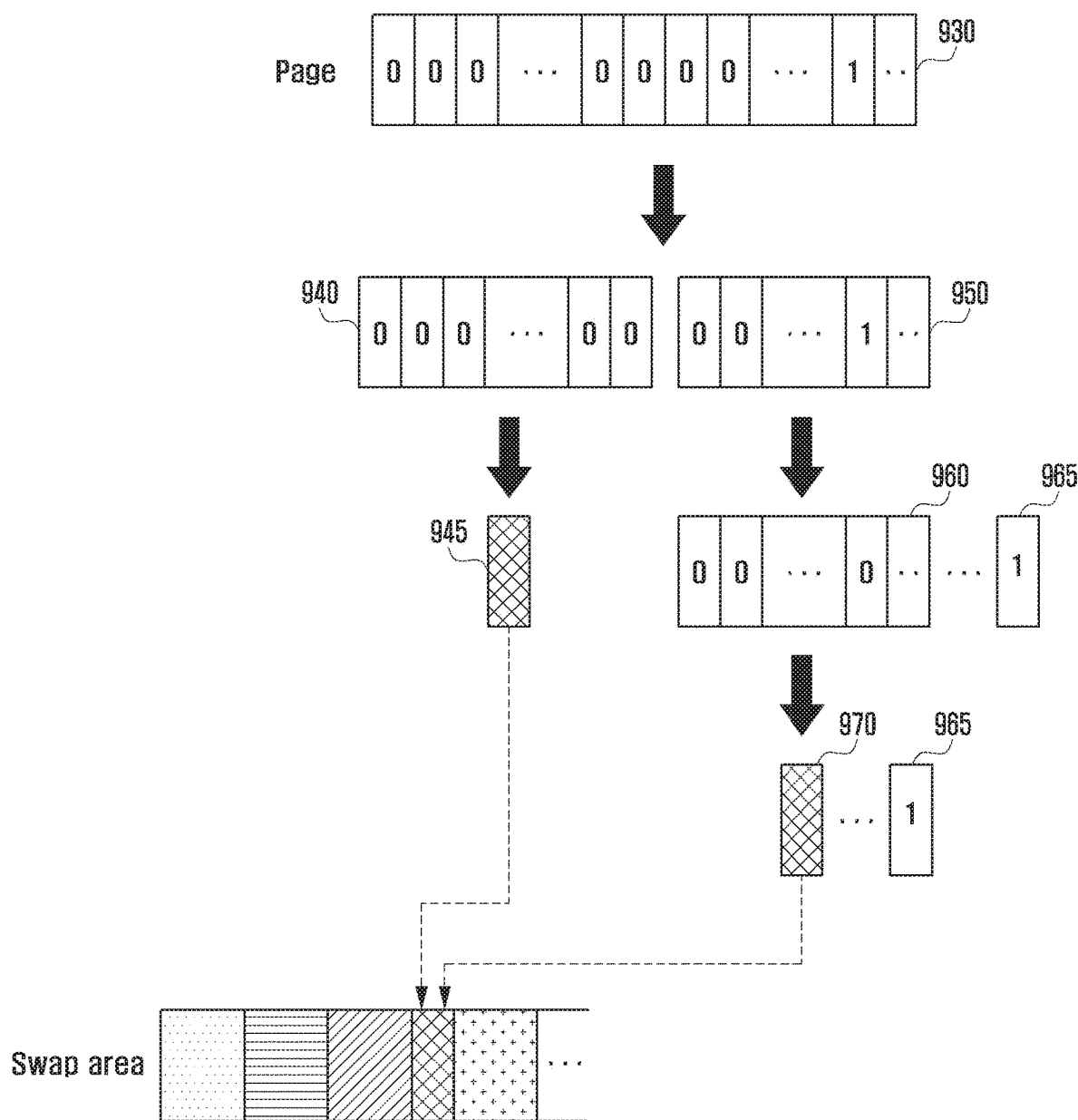

ELECTRONIC DEVICE AND DATA COMPRESSION METHOD THEREOF

TECHNICAL FIELD

The present disclosure relates to an electronic device and a data compression method of the same. More specifically, the present disclosure proposes an electronic device for efficiently managing memory and a data compression method of the same.

BACKGROUND ART

In order to efficiently manage memory of an operating system (OS), a memory redundancy removal technology for increasing available memory is used.

For example, swap is a technology in which an OS periodically checks memory and moves an expected process that belongs to processes being performed on the memory and that is expected to be not performed for some time to a preset swap area, thereby securing available memory.

However, there is a problem in that overhead is generated due to swap-in in which a process is moved from the memory to the swap area and swap-out in which a process is moved from the swap area to the memory. Furthermore, there may be a problem in that the lifespan of flash memory is reduced because swap is used in a device using a flash-based storage unit.

Meanwhile, in order to solve the aforementioned problems, a method of compressing a swapped-out page, storing the page in system memory, restoring the compression in the case of swap-in, and using the restored page is used.

However, there is a problem in that the usage of the system memory is increased even by such a method because compressed data is stored in the system memory.

Accordingly, there is a need to consider a method capable of reducing I/O overhead and also maintaining the usage of system memory to a specific level.

DISCLOSURE OF INVENTION

Technical Problem

The present disclosure provides an electronic device capable of reducing redundant storage for a page including the same data if a swapped-out page is to be compressed and stored in order to efficiently manage memory and a data compression method of the same.

Solution to Problem

A data compression method of an electronic device according to an embodiment of the present disclosure may include the steps of compressing a page, determining whether data included in the compressed page has been stored in memory, and merging the compressed page into previously stored data, if the data included in the compressed page is identical with the data previously stored in the memory.

Furthermore, the merging step may include mapping the compressed page to a page of the memory in which the previously stored data is included.

Meanwhile, the data compression method may further include the step of allocating memory, if the data included in the compressed page has not been stored in the memory, and storing the compressed page in the allocated memory.

Furthermore, the compressing step may include changing a preset number of specific bits included in the page into a specific value and compressing the page including the specific bit changed into the specific value.

Meanwhile, the merging step may include mapping a value of the original data included in the specific bit prior to a change into the specific value or an address at which a value of the original data has been stored and merging the compressed page into the previously stored data.

Furthermore, the preset number of specific bits included in the page may be a bit included in a predetermined location in the page or a bit included in a variable location according to data included in the page.

Meanwhile, an electronic device according to an embodiment of the present disclosure may include memory configured to store data, and a controller configured to compress a page, determine whether data included in the compressed page has been stored in memory, and merge the compressed page into previously stored data, if the data included in the compressed page is identical with the data previously stored in the memory.

Furthermore, the controller is configured to map the compressed page to a page of the memory in which the previously stored data is included.

Meanwhile, the controller is configured to allocate memory area if the data included in the compressed page has not been stored in the memory, and store the compressed page in the allocated memory area.

Furthermore, the controller is configured to change a preset number of specific bits included in the page into a specific value and compress the page including the specific bit changed into the specific value.

Meanwhile, the controller is configured to map a value of original data included in the specific bit prior to a change into the specific value or an address at which a value of the original data has been stored, and merge the compressed page into the previously stored data.

Furthermore, the preset number of specific bits included in the page may be a bit included in a predetermined location in the page or a bit included in a variable location according to data included in the page.

Advantageous Effects of Invention

In accordance with an embodiment of the present disclosure, the electronic device can increase memory-securing efficiency by not storing a page including the same or similar data in a swap area by plural times although the number of swapped-out pages is increased.

BRIEF DESCRIPTION OF DRAWINGS

FIG. 4 is a diagram showing a page frame number, a page storage address and an index number mapping table capable of being stored in the electronic device in accordance with an embodiment of the present disclosure, FIGS. 9A and 9B are diagrams for illustrating a method of compressing segmented pages in accordance with an embodiment of the present disclosure.

MODE FOR THE INVENTION

Figure 1:
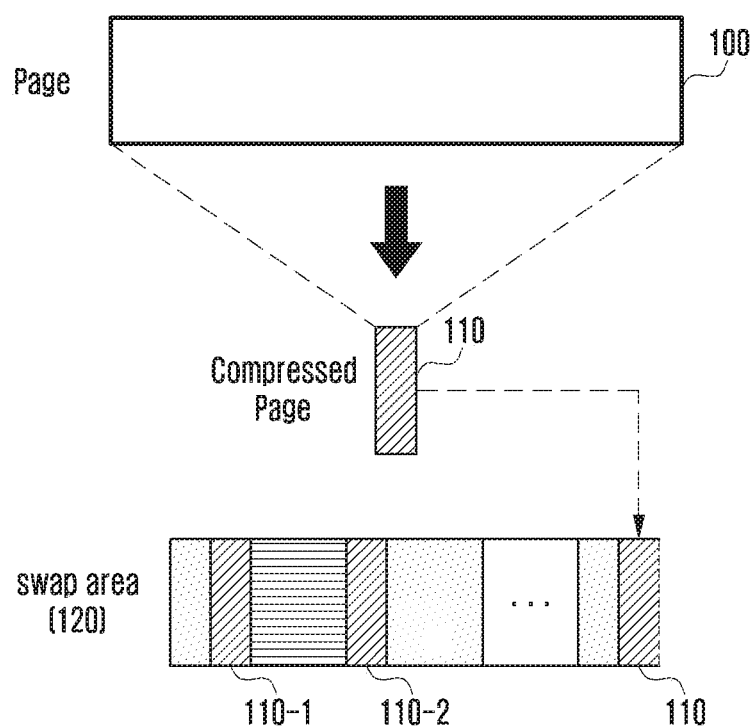
FIG. 1 is a diagram showing a method of storing commonly compressed page in a swap area.

The present embodiments may be modified in various ways and may have several embodiments. Specific embodiments are to be illustrated in the drawings and to be described the detailed description. It is however to be understood that the scope is not intended to be limited to specific embodiments, but that the specific embodiments include all of modifications, equivalents and/or substitutions included in the disclosed spirit and technological scope. In describing the embodiments, a detailed description of the known technologies will be omitted if it is deemed to make the gist unnecessarily vague.

Terms, such as the first and the second, may be used to describe various elements, but the elements should not be restricted by the terms. The terms are used to only distinguish one element from the other element.

The terms used in this application are used to describe specific embodiments only and are not intended to restrict the scope of right. An expression of the singular number includes an expression of the plural number unless clearly defined otherwise in the context. In this application, terms, such as "include" or "have", are intended to designate that characteristics, numbers, steps, operations, elements, or parts which are described in the specification, or a combination of them exist, and should not be understood that they exclude the existence or possible addition of one or more other characteristics, numbers, steps, operations, elements, parts, or combinations of them in advance.

In the embodiments, a "module" or "unit" performs at least one function or operation and may be implemented by hardware or software or a combination of hardware and software. Furthermore, a plurality of "modules" or a plurality of "units" may be integrated into at least one module other than a "module" or "unit" that may need to be implemented as a piece of specific hardware and may be implemented as at least one processor (not shown).

FIG. 1 is a diagram showing a method of storing commonly compressed page in a swap area.

In general, the kernel of an electronic device is to secure available memory of a specific level or more in order to smoothly perform memory allocation requested by a system. Accordingly, the kernel periodically checks available memory of the system. When available memory drops to a specific level or less, the kernel drives a thread called a swap daemon, thus being capable of securing available memory.

The swap daemon wakes up in response to a request from the kernel, and may secure available memory by storing a page that belongs to pages being used and that is used long before in secondary storage, such as a hard disk, and deleting the page from memory.

A page is a consecutive section having a fixed length in a virtual address space and means a basic unit forming the virtual address space. In general, a page may have a length of 4 kb.

While the swap daemon performs an operation of storing a page used long before in secondary storage, heavy I/O overhead may occur. A scheme for solving the I/O overhead includes swap through compression.

In the swap through compression, when the swap daemon performs swap-out, it does not store the page used long before in the secondary storage. The swap daemon may compress the page used long before and store the page used long before in an allocated memory pool of the system memory. For example, the memory pool may mean some region of the system memory.

In this case, the storing of the compressed page in the system memory is merely an embodiment. In some embodiments, the compressed page may be stored in secondary storage, such as a disk, or primary storage, such a RAM.

Hereinafter, a method of an invention being implemented is described based on an embodiment in which a compressed page is stored in system memory.

Furthermore, when the swap daemon stores the compressed page in the memory pool, it may also store meta data for storing the compressed page to the state prior to compression if swap-in is performed in response to a read/write request for the page.

Available memory is also increased because I/O overhead is reduced and a page is compressed and stored by the aforementioned method.

If the number of swapped-out pages is increased, however, the usage of system memory also increases, so memory-securing efficiency through swap-out may be deteriorated.

Specifically, as shown in FIG. 1, an electronic device may generate a compressed page 110 by compressing a page 100 that is used long before and an object to be swapped out. Furthermore, the electronic device may increase available memory by storing the compressed page 110 in a swap area 120 (e.g., system memory).

Although the data 110-1 and 110-2 of the same contents as those of the compressed page 110 has been previously stored in the swap area 120, the electronic device stores the compressed page 110 in the swap area 120 again.

Accordingly, if the number of swapped-out pages increases as described above, memory-securing efficiency through swap-out is deteriorated because data of the same contents is stored in the swap area 120 by plural times.

Hereinafter, a method capable of efficiently securing available memory while solving the problems is described with reference to FIG. 2.

Figure 2:
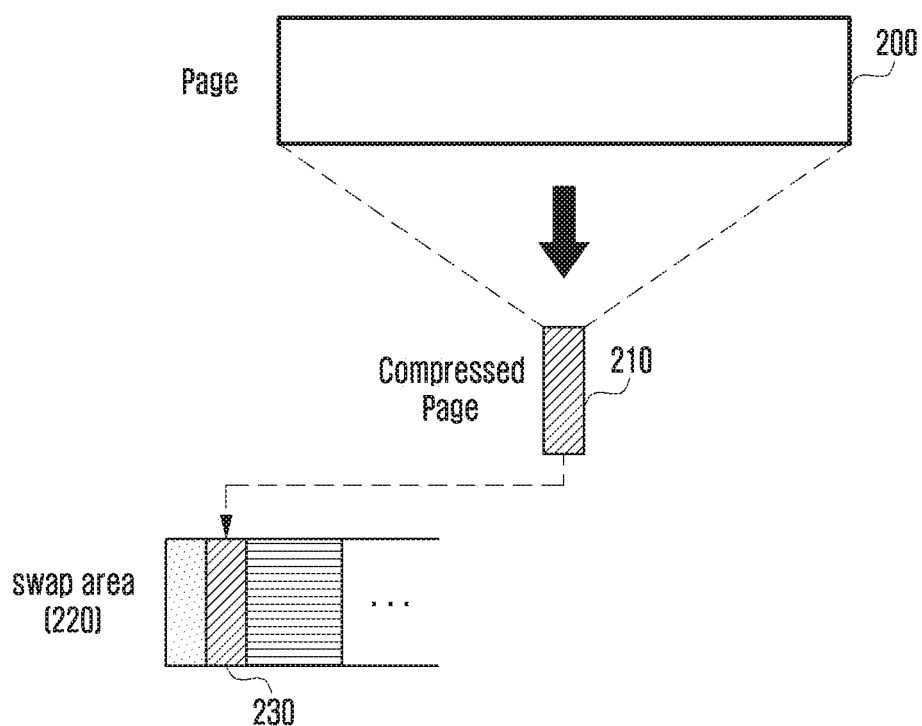
FIG. 2 is a diagram showing a method of storing a compressed page in a swap area in accordance with an embodiment of the present disclosure.

FIG. 2 is a diagram showing a method of storing a compressed page in a swap area in accordance with an embodiment of the present disclosure.

Specifically, an electronic device may determine a page after a preset time or more from the last use to be a page 200, that is, an object to be swapped out. However, this is only an embodiment and the page 200, that is, an object to be swapped out, may be determined according to setting or in response to a user command.

The electronic device may compress the page 200. Furthermore, the electronic device may determine whether data included in the compressed page 210 has been stored in the swap area 220 of memory.

If, as a result of the determination, the data included in the compressed page 210 is the same as data 230 previously stored in the swap area 220, the electronic device may merge the compressed page 210 into the previously stored data 230.

The merger of the compressed page 210 may mean that the electronic device maps the compressed page 210 to the previously stored data 230 of the swap area 220. For example, the electronic device may map the address of the compressed page 210 to the address of the previously stored data 230.

By the aforementioned data page merger, the electronic device does not store the same data by plural times if the data included in the compressed page 210 is the same as the data 230 previously stored in the swap area 220.

Meanwhile, if, as a result of the determination, the data included in the compressed page 210 is not stored in the swap area 220, the electronic device may generate a memory pool and store the compressed page 210 in the memory pool.

As a result, although the number of swapped-out pages increases, the electronic device allows the data of the same contents to be not stored in the swap area 120 by plural times, thereby being capable of improving memory-securing efficiency.

The electronic device may merge and store pages including the same data in the state in which first booting has been performed and memory has been reset, as described in FIG. 2.

Figure 3A:
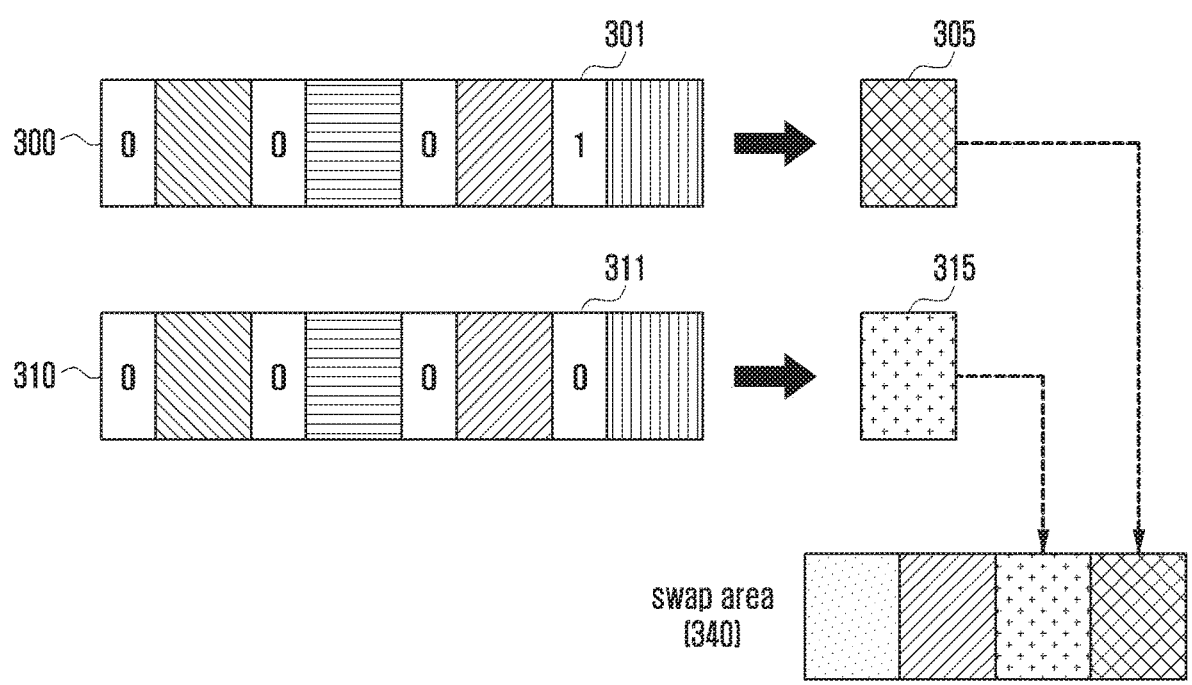
FIG. 3A is a diagram showing compression data generated by compressing similar pages, respectively.

Meanwhile, FIG. 3A is a diagram showing compression data generated by compressing similar pages.

As shown in FIG. 3A, a first page 300 and second page 310 in which data included in all of bits is the same and only data included in a single bit is different are taken as examples.

The n-th bit 301 of the first page 300 includes "1", but the n-th bit 311 of the second page 310 includes "0."

The contents of the data included in the first page 300 and the second page 310 are very similar, but the data included in the n-th bits are different. Accordingly, the compression data of the first page 300 and the second page 310 is different. Specifically, the compression data 305 of the first page 300 and the compression data 315 of the second page 310 may be different compression data.

Accordingly, if compressed data is to be swapped out by the method described in FIG. 2, the compression data 305 of the first page 300 and the compression data 315 of the second page 310 are stored in a swap area 340 although they are very similar.

Figure 3B:
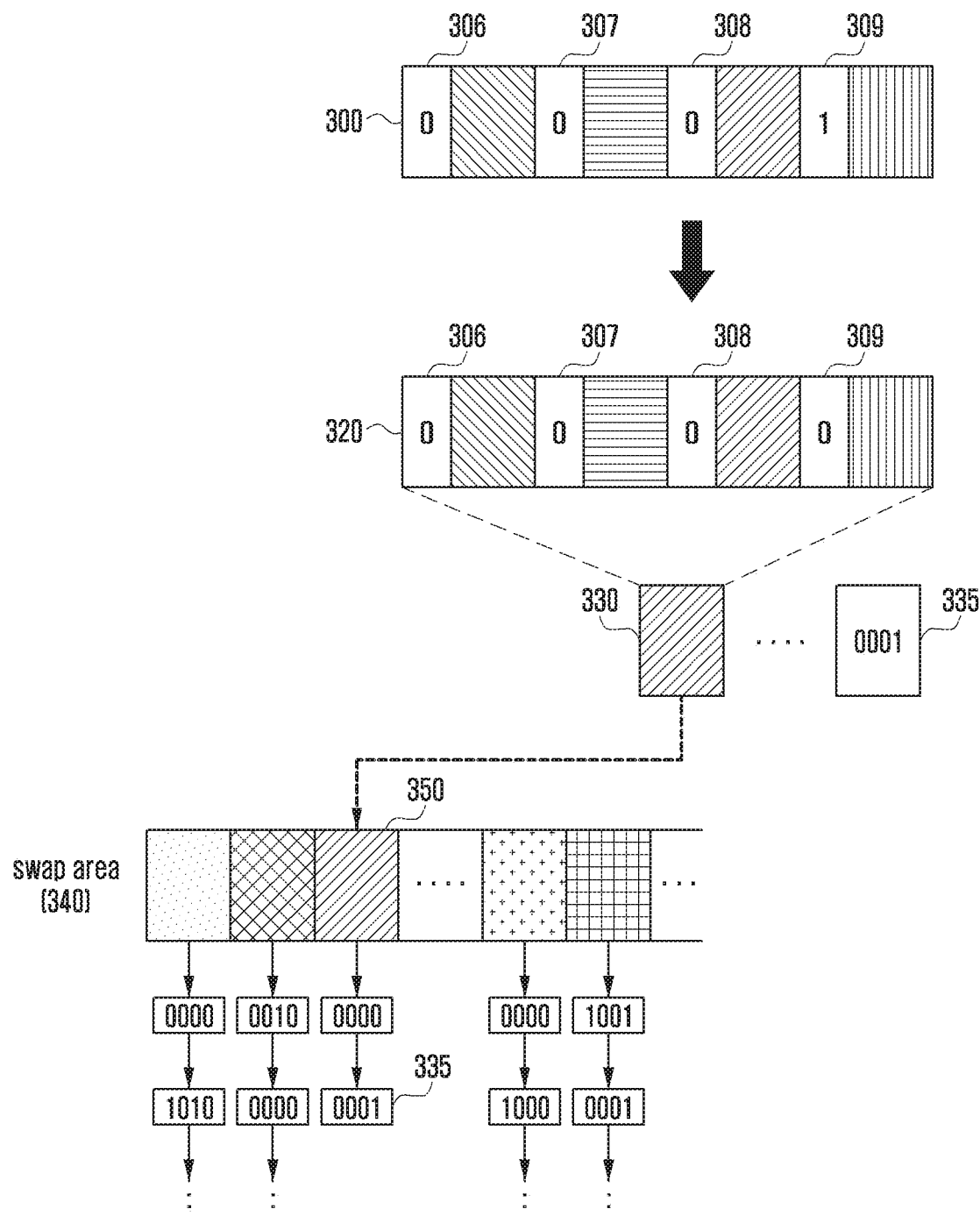
FIG. 3B is a diagram showing a method of storing a compressed page in a swap area in accordance with an embodiment of the present disclosure.

FIG. 3B illustrates a method for improving memory efficiency by storing pages whose contents of data included therein are not the same, but are similar in a swap area once.

First, an electronic device may change a preset number of specific bits included in a page 300 into a specific value. For example, the electronic device may set bits 306, 307, 308, and 309 at specific locations of the page as magic bits. Furthermore, the electronic device may change data included in the preset magic bits 306, 307, 308, and 309 into a specific value, such as "0." What the specific value is "0" is only an embodiment, and may be determined to be a different value depending on the initial setting of the electronic device, the type of application or user setting.

In the embodiment shown in FIG. 3B, some magic bits 306, 307, and 308 of the magic bits 306, 307, 308, and 309 already include "0." Accordingly, the electronic device may change the data of the magic bit 309 including "1" into a specific value "0."

The electronic device may generate compressed data 330 by compressing a page 320 in which the data of the preset magic bits 306, 307, 308, and 309 has been changed into the specific value "0." At this time, the electronic device may generate the original value prior to a change of the magic bits 306, 307, 308, and 309 as meta data 335.

The electronic device may determine the same data as the compressed data 330 has been previously stored in a swap area 340. If, as a result of the determination, it is determined that the same data 350 as the compressed data 330 has been stored in the swap area 340, the electronic device may merge the compressed data 330 into the same data 350.

Furthermore, the electronic device may map the meta data 335 together while merging the compressed data 330 into the previously stored same data 350.

Accordingly, if swap-in is subsequently performed on the compressed data 330, the electronic device can obtain the original page 300 by restoring the same data 350 and substituting a value included in the meta data 335 for the magic bits 306, 307, 308, and 309 of the restored data.

Figure 3C:
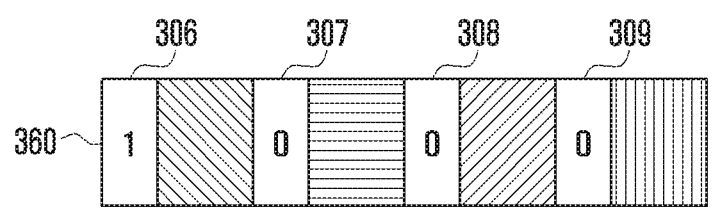
FIGS. 3C and 3D are diagrams showing pages changed into the same page in accordance with an embodiment of the present disclosure.
Figure 3D:
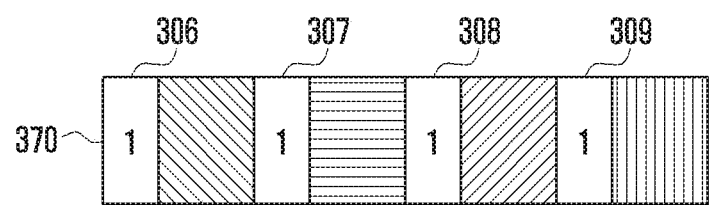

FIGS. 3c and 3d are diagrams showing pages 360 and 370 which may be changed into the changed page 320 as shown in FIG. 3B in accordance with another embodiment of the present disclosure.

For example, in the page 360 of FIG. 3C, data of "1", "0", "0" and "0" is sequentially stored in the magic bits 306, 307, 308, and 309 at preset locations, respectively. The electronic device may change the magic bits 306, 307, 308, and 309 of the page 360 into a specific value "0" by the aforementioned method. Accordingly, the page 360 may become the same as the changed page 320 of FIG. 3B.

The electronic device may generate the compressed data 330 by compressing the page 320 in which the data of the preset magic bits 306, 307, 308, and 309 has changed into the specific value "0." At this time, the electronic device may generate the original values prior to a change of the magic bits 306, 307, 308, and 309 as meta data, "1000."

The electronic device may map the meta data "1000" together while merging the compressed data 330 into the previously stored data 350 of the swap area 340.

Meanwhile, in the page 370 of FIG. 3D, data of "1", "1", "1" and "1" has been sequentially included in the magic bits 306, 307, 308, and 309 at preset locations, respectively. The electronic device may change the magic bits 306, 307, 308, and 309 of the page 370 into a specific value "0" by the aforementioned method. Accordingly, the page 370 may become the same as the changed page 320 of FIG. 3B.

The electronic device may generate the compressed data 330 by compressing the page 320 in which the data of the preset magic bits 306, 307, 308, and 309 has changed into the specific value "0." At this time, the electronic device may generate the original value prior to a change of the magic bits 306, 307, 308, and 309 as meta data "1111."

The electronic device may map the meta data "1111" together while merging the compressed data 330 into the previously stored data 350 of the swap area 340.

By the aforementioned method, the electronic device may map pages in which the remaining data other than some of data included in the magic bits 306, 307, 308, and 309 are the same or similar to the same region of the swap area. Accordingly, the electronic device can improve available memory efficiency.

The magic bit described through FIGS. 3a to 3d may mean a bit that belongs to bits included in a specific page and that has a frequently changed data value while the data of the specific page is by plural times changed and stored.

Figure 8:
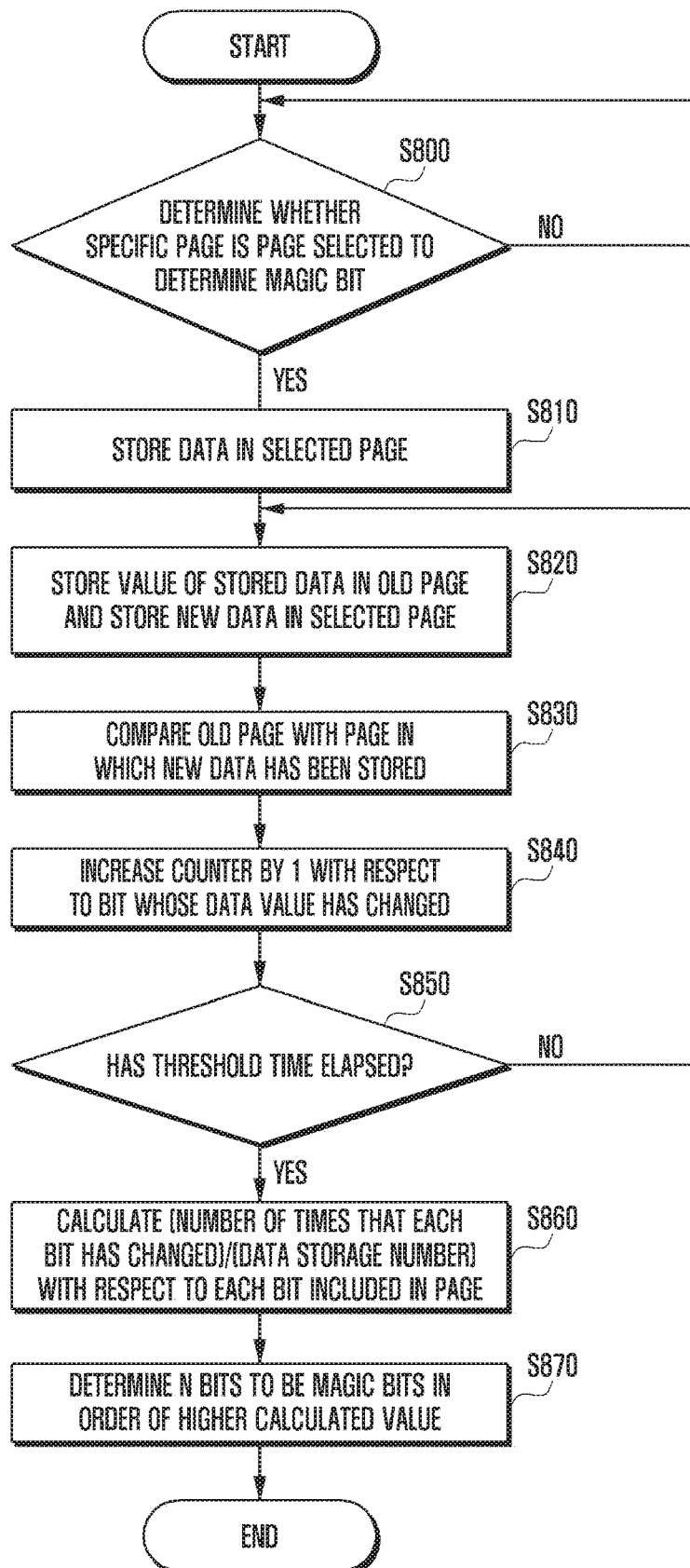
FIG. 8 is a flowchart showing a method for the electronic device to determine a magic bit according to an embodiment of the present disclosure.

Hereinafter, a method for an electronic device to determine a magic bit is described in detail with reference to FIG. 8.

The electronic device may perform an operation for determining a magic bit with respect to all of pages. In this case, at operation S800, the electronic device may determine whether a specific page is a page selected to determine a magic bit in order to reduce a load generated by performing an operation of determining the magic bit.

For example, the electronic device may perform a specific operation, such as memset or memcpy, on a plurality of pages. As a result of the execution, the electronic device may select a page including the same data as a page for determining the magic bit.

At operation S810, the electronic device may store data in the page selected to determine the magic bit. The number of pages for determining the magic bit may be plural.

At operation S820, the electronic device may store a value of the stored data in an old page and store new data in the selected page.

Furthermore, at operation S830, the electronic device may compare the old page with the page in which the new data has been stored. For example, the electronic device may determine whether a value of a bit included in the old page and a value of a bit at the same location of the page in which the new data has been stored have changed.

At operation S840, the electronic device may increase a counter by 1 with respect to a bit whose data value has changed.

The electronic device may repeatedly perform the aforementioned operation for a threshold time. Furthermore, if it is determined that threshold time has elapsed at operation S850, at operation S860, the electronic device may calculate (the number of times that each bit has changed)/(data storage number) with respect to each bit included in the page.

At operation S870, the electronic device may determine N bits to be magic bits in order of higher calculated value.

For example, if a specific app is driven, the electronic device may perform merger on a compressed page using a magic bit. Specifically, if the electronic device drives a camera app, the camera app requests memory of about 700 MB or higher. In this case, the memory of 700 MB may be used after it is reset to "0" through memset. Accordingly, the electronic device may select pages reset by performing memset as pages for calculating a magic bit.

Meanwhile, if data is written in a specific page, the electronic device may include a separate module for determining whether the specific page is a page predetermined to select a magic bit. Accordingly, the method of determining a magic bit, disclosed in FIG. 8, may be performed by an electronic device or the separate module included in the electronic device.

Figure 9A:
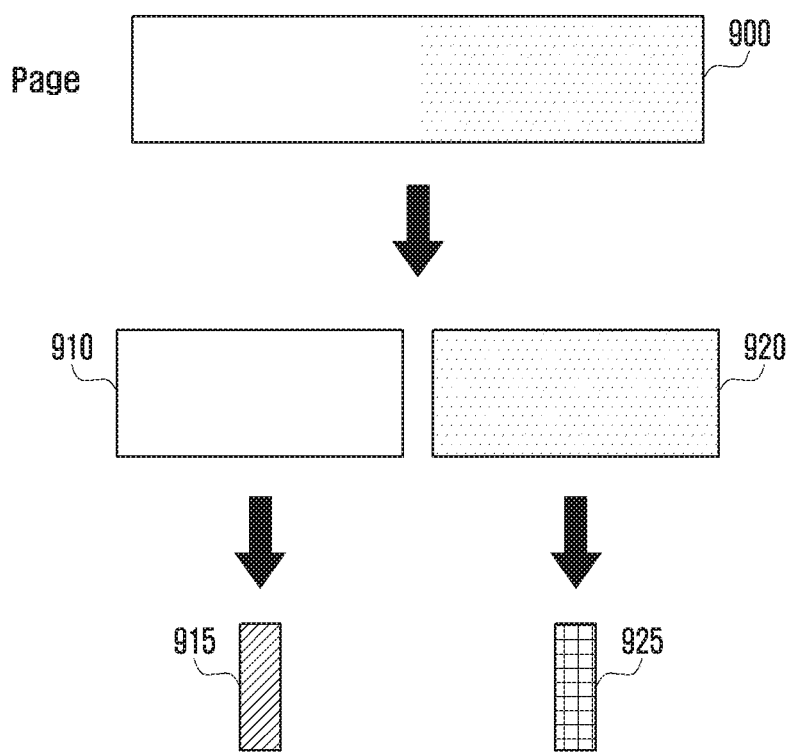

In accordance with an embodiment of the present disclosure, a unit by which an electronic device performs compression may be a page unit, but is not limited thereto. For example, as shown in FIG. 9A, an electronic device may segment a single page 900 into two and compress each of the segmented data 910 and 920. For example, if the single page 900 is segmented into two, if it is determined that there is a high probability that data of the same contents will be included, the electronic device may segment the single page 900 into two. Furthermore, the electronic device may generate compressed two data 915 and 925 by compressing the segmented data 910 and 920, respectively. In this case, the electronic device may match the compressed two data 915 and 925 with the original size values of the segmented data 910 and 920, respectively, and store them.

In accordance with another embodiment, the electronic device may segment a page, may change the data of the magic bits of the segmented pages into a specific value, and may compress the data.

FIG. 9B illustrates an example in which most data of a single page 930 is filled with "0" and data "1" is included at one end of the page. If the page 930 is segmented, an electronic device may determine that a partial page including only data "0" may be generated.

Accordingly, the electronic device may generate a first partial page 940 and a second partial page 950 including data "0" only by segmenting the page 930. The electronic device may generate first partial compression data 945 by compressing the first partial page 940 including the data "0" only.

Furthermore, the electronic device may change a bit including the data "1" of the second partial page 950 into data "0." The electronic device may generate second partial compression data 970 by compressing a changed second partial page 960 that has become the same as the first partial page 940. Furthermore, the electronic device may form the data "1" of the second partial page 950 as meta data, may map the meta data to the second partial compression data 970, and may store the data.

Since the first partial page 940 and the changed second partial page 960 include the data "0" only, the electronic device may store the first partial compression data 945 and the second partial compression data 970 in the same swap area. Furthermore, the electronic device may map the second partial compression data 970 to the meta data and store the data.

Meanwhile, an electronic device has been illustrated as segmenting a single page into two partial pages of the same size, but this is only an embodiment. An electronic device may segment a single page into a plurality of partial pages, and the partial pages may have different sizes.

In accordance with an embodiment of the present disclosure, as shown in FIG. 4, an electronic device may store a table 400, including a page frame number (PFN) 410 of a compressed page, an address 420 of a compressed page 420, and an index number 430, that is, information about the meta data of a compressed page.

Specifically, each page may have a unique frame number. Accordingly, if a compressed page is swapped out, an electronic device may map an address of the compressed page to an address where a compression page having the same data as that of a compressed page of a swap area is present. In this case, the electronic device may generate a table in which a frame number 410 of the swapped-out page is mapped to the address 420 of the compression page including the same data.

Furthermore, if the magic bit of the swapped-out page is changed into a specific value by the aforementioned method, the electronic device may add the original value of the magic bit to the table as an index value 430. Meanwhile, the index value 430 is not limited to the original value of the magic bit, but may be the address of an area in which the original value has been stored.

Meanwhile, the aforementioned preset number of specific bits may be a bit included in a predetermined location in the page or may be a bit included in a variable location depending on data included in the page.

What a specific bit corresponds to any one of bits included in each page and how many specific bits are included in a single page may have been previously determined. However, this is only an embodiment and an electronic device may set a magic bit whose location is variable depending on initial setting, user setting, an execution program or the type of app.

For example, if swap is performed, an electronic device may compare pages, that is, objects to be swapped. If, as a result of the comparison, it is found that data included in the remaining bits is the same other than some bits (e.g., 4 bits) of a plurality of pages, the electronic device may set the some excluded bits as magic bits. Furthermore, the electronic device may change data included in the magic bits into a specific value, may compress the pages including the changed specific value, and may swap out the pages according to the aforementioned method.

Figure 5:
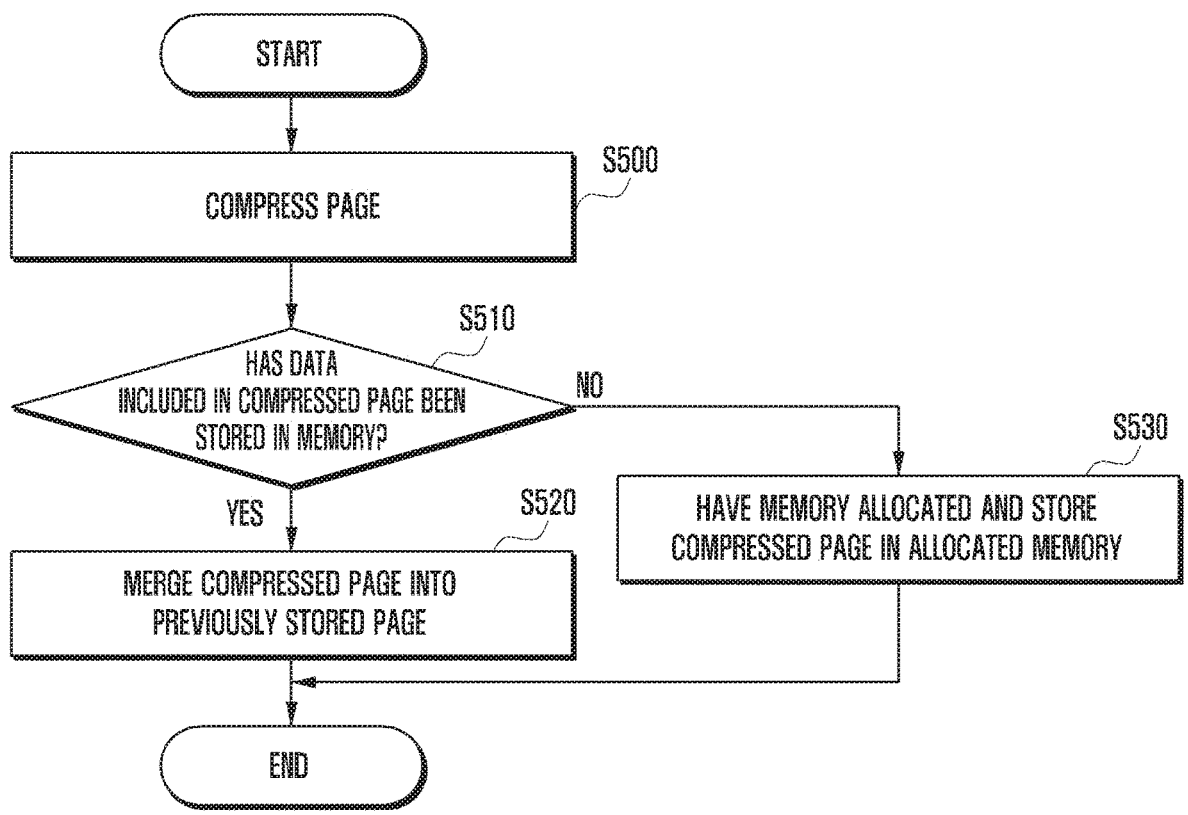
FIG. 5 is a flowchart showing a data compression method according to an embodiment of the present disclosure.

Meanwhile, FIG. 5 is a flowchart showing a data compression method according to an embodiment of the present disclosure. First, at operation S500, an electronic device compresses a page. The electronic device may select a page to be compressed and stored in order to perform swap. For example, the electronic device may determine a page after a lapse of a preset time or more from the last use to be the page, that is, an object to be swapped out. However, this is only an embodiment, and a page, that is, an object to be swapped out, may be determined according to setting or in response to a user command.

At operation S510, the electronic device determines whether data included in the compressed page has been stored in memory.

If, as a result of the determination, a compression page including the same data as the data included in the compressed page has been previously stored in the memory, the electronic device merges the compressed page into the previously stored page at operation S520. For example, the electronic device may point an address of the compressed page as a storage address of the compression page previously stored in the memory.

Meanwhile, if, as a result of the determination, a compression page including the same data as the data included in the compressed page has not been previously stored in the memory, memory may be allocated to the electronic device and the electronic device may store the compressed page in the allocated memory at operation S530.

Figure 6:
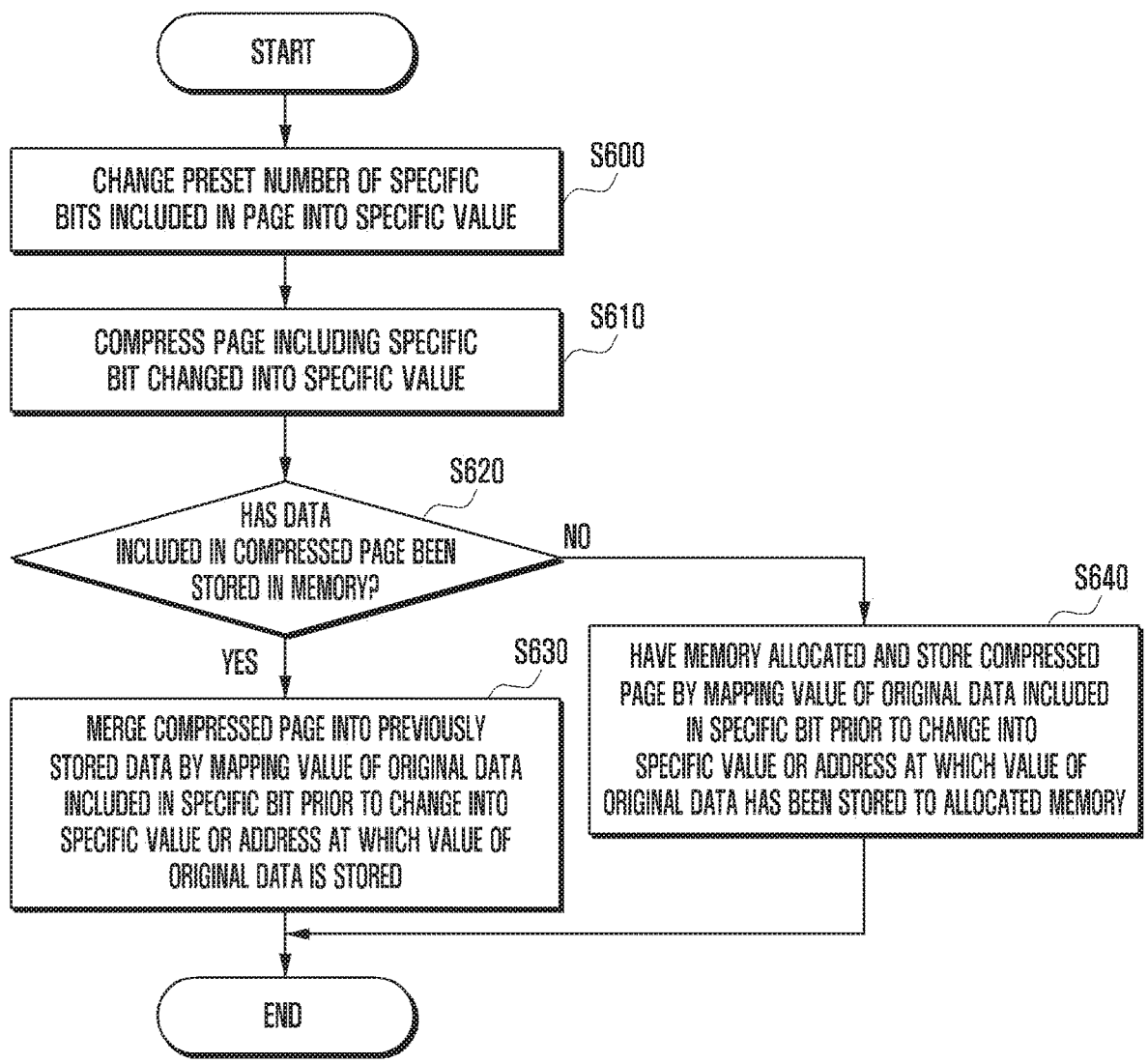
FIG. 6 is a flowchart specifically showing a data compression method according to an embodiment of the present disclosure.

Hereinafter, a method of improving memory efficiency by storing a page including similar data in the same region of a swap area is described with reference to FIG. 6.

At operation S600, an electronic device may change a preset number of specific bits included in a page into a specific value. For example, the electronic device may set a bit at a specific location of a page as a magic bit. Furthermore, the electronic device may change data included in a preset magic bit into a specific value, such as "0." The specific value has been illustrated as being "0", but this is only an embodiment and may be determined to be a different value depending on the initial setting of the electronic device, the type of application or user setting.

At operation S610, the electronic device may compress a page including a specific bit changed into the specific value. For example, the electronic device may generate compressed data by compressing a page in which data of a preset magic bit has been changed into the specific value "0." In this case, the electronic device may generate the original value prior to a change of the magic bit as meta data.

Furthermore, at operation S620, the electronic device may determine whether data included in the compressed page has been stored in the memory. For example, the electronic device may determine whether the same data as the compressed data has been previously stored in a swap area.

If, as a result of the determination, it is determined that the same data as the compressed data has been stored in the swap area, at operation S630, the electronic device may merge the compressed data into the previously stored data by mapping a value of the original data included in the specific bit prior to the change into the specific value or an address at which a value of the original data is stored.

For example, the electronic device may generate a value of the original data of the magic bit as meta data while changing the data of the magic bit into the specific value, and may map the meta data to the previously stored data along with the compressed data.

Alternatively, the electronic device may store a value of the original data of a magic bit that is separately generated, while changing the data of the magic bit into the specific value, in a preset region, and may map an address of the preset region in which the value of the original data of the magic bit has been stored together while mapping the compressed data to the previously stored data. Furthermore, the electronic device may map the meta data 335 together while merging the compressed data into the previously stored same data 350.

Accordingly, if swap-in is subsequently performed on the compressed data, the electronic device can obtain the original page by restoring the same data and substituting the value included in the meta data for the magic bit of the restored data.

Meanwhile, if, as a result of the determination, it is determined that the same data as the compressed data has not been previously stored in the swap area, at operation S640, memory may be allocated to the electronic device, and the electronic device may store the compressed page by mapping a value of the original data included in the specific bit prior to the change into the specific value or an address at which the value of the original data has been stored to the allocated memory.

Figure 7:
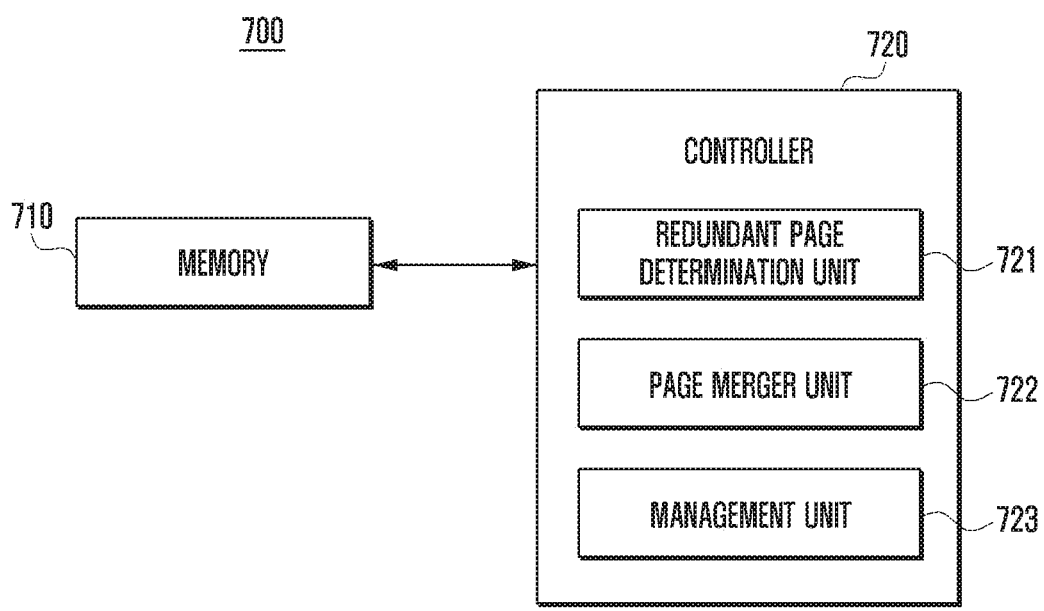
FIG. 7 is a block diagram showing a constitution of an electronic device according to an embodiment of the present disclosure.

FIG. 7 is a block diagram showing an electronic device according to an embodiment of the present disclosure. As shown in FIG. 7, the electronic device 700 may include memory 710 and a controller 720. The electronic device 700 may be implemented as various devices, such as a mobile phone, a tablet PC, a digital camera, a camcorder, a notebook PC, a desktop PDA, MP3, smart glasses, a smart watch or a smart ring.

The memory 710 is an element for storing data. The memory 710 stores various programs and data for driving the electronic device 700. For example, the memory 710 may store an operating system (OS) for driving the electronic device 700, apps for performing various functions, and data used in a process of executing the apps. In addition, the memory 710 may store a variety of types of software, such as a base module, a sensing module, a communication module, a presentation module, a web browser module, and a service module.

The memory 710 may include primary storage, including RAM, ROM and L1, L2 cache memory, and secondary storage including a hard disk. For example, the secondary storage of the memory 710 may store a swapped-out page.

Meanwhile, the controller 720 is an element for generally controlling the electronic device 700. The controller 720 may further include elements, such as a redundant page determination unit 721, a page merger unit 722 and a management unit 733. The elements included in the controller 720 may be implemented as separate hardware modules. However, this is only an embodiment. The redundant page determination unit 721, the page merger unit 722 and the management unit 733 may be implemented in software, and the controller 720 may perform a function of storing a program in non-volatile memory, copying the stored programs to RAM, and executing the copied programs.

The redundant page determination unit 721 may compress a page, that is, an object to be swapped. Furthermore, the redundant page determination unit 721 may determine whether data included in the compressed page has been previously stored in a swap area.

Furthermore, the redundant page determination unit 721 may change data included in a preset specific bit of a page into a specific value (e.g., "0"). Furthermore, the redundant page determination unit 721 may compress a page in which the specific bit is filled with the specific value. The redundant page determination unit 721 may generate the original data value prior to a change of a specific value of the specific bit as meta data.

Meanwhile, the page merger unit 722 may merge a page based on a result of the determination of the redundant page determination unit 721. For example, if the redundant page determination unit 721 determines that the same data as data included in a compressed page has been previously stored in a swap area of the memory 710, the page merger unit 722 may merge the compressed page into the previously stored page. For example, the page merger unit 722 may map the storage address of the compressed page to the address of the previously stored page.

Furthermore, the page merger unit 722 may map the meta data together while merging the compressed page into the previously stored page.

Meanwhile, if the redundant page determination unit 721 determines that the same data as the data included in the compressed page has not been previously stored in the swap area of the memory 710, the page merger unit 722 may allocate some region of the memory 710 and store the compressed page in the allocated region.

The management unit 733 may manage merged pages. The management unit 733 may map the frame page number of a compressed page and the storage address of the compressed page and manage them. Furthermore, if a specific bit of the compressed page has changed into a specific value, the management unit 733 may map meta data including the original value of the specific bit along with the frame page number of the compressed page and the storage address of the compressed page and manage them.

Accordingly, if swap-in is subsequently performed, the compressed page can be restored using the storage address and the meta data.

In the technology, the controller 720 has been illustrated as including the separate function blocks 721 to 723, and the controller 720 and the detailed function blocks 721 to 723 have been illustrated as performing different functions, but this is only an embodiment that may be implemented. For example, a function performed by the redundant page determination unit 721 may be performed by the controller 720 itself.

Although the number of swapped-out pages increases, the electronic device 700 prevents a page including the same or similar data from being stored in the memory by plural times, thereby being capable of improving memory-securing efficiency.

Meanwhile, the elements of the aforementioned electronic device may be implemented in the form of software. For example, the controller of the electronic device may further include flash memory or other non-volatile memory. Programs for performing the respective functions of the controller may be stored in the non-volatile memory.

Furthermore, the controller of the electronic device may be implemented in a form including a CPU and random access memory (RAM). The CPU of the controller may copy the aforementioned programs stored in the non-volatile memory to the RANI, and may perform functions of the electronic device, such as those described above, by executing the copied programs.

The controller is an element responsible for control of the electronic device. The controller may be interchangeably used as the same meaning, such as a central processing unit, a micro processor, a controller, a processor or an operating system. Furthermore, the controller of the electronic device may be implemented as a system-on-a-chip (or system on chip or SOC or SoC) along with other functions units, such as a communication module included in the electronic device.

Meanwhile, the data compression method of the electronic device according to the aforementioned various embodiments may be coded in software and stored in a non-transitory readable medium. The non-transitory readable medium may be mounted on various devices and used.

The non-transitory readable medium does not mean a medium that stores data for a short time, such as a register, a cache or memory, but means a medium that stores data semi-permanently and that can be read by a device. Specifically, the non-transitory readable medium may be a CD, a DVD, a hard disk, a Blueray disk, a USB, a memory card or ROM.

Furthermore, although the preferred embodiments of the present disclosure have been illustrated and described above, the present disclosure is not limited to the aforementioned specific embodiments, and a person having ordinary skill in the art to which the present disclosure pertains may modify the present disclosure in various ways without departing from the gist of the present disclosure in the claims. Such modified embodiments should not be individually understood from the technical spirit or prospect of this specification.

The invention claimed is:

1. A method of an electronic device, the method comprising:
    determining a magic bit among bits of a first page, based on a number of times of change of data value in the first page during a predetermined time, wherein the magic bit is a bit that belongs to the bits of the first page and that has a frequently changed data value while data of the first page is by plural times changed and stored;
    dividing the first page into a first partial page and a second partial page, wherein the first partial page includes the magic bit, and the second partial page excludes the magic bit;
    changing an original value of the magic bit to a specific value;
    generating meta data indicating the changed original value of the magic bit;
    compressing the first partial page in which the original value of the bit among bits of the first page is changed to the specific value;
    compressing the second partial page;
    after compressing the first partial page and the second partial page, identifying whether first data including the specific value is identical to second data included in a compressed second page stored in a memory; and
    storing, in case that the first data is identical with the second data, the compressed first page and the meta data in the memory, by merging the compressed first partial page and the second partial page into the compressed second page, wherein an index of the meta data is mapped to an address of the compressed first page, and wherein the index of the meta data includes the original value corresponding to the specific value or an address of an area where the original value is stored.

2. The method of claim 1, wherein the merging of the compressed first partial page and the second partial page into the compressed second page comprises mapping the address of the compressed first page to an address of the compressed second page in the memory.

3. The method of claim 2, wherein the first data is generated by changing a preset number of specific bits of original data included in the first page into the specific value.

4. The method of claim 3, wherein the specific bits are included in a predetermined location in the first page, and wherein the predetermined location is determined based on data included in a page.

5. An electronic device, comprising:

memory configured to store data; and a controller configured to:

determine a magic bit among bits of a first page, based on a number of times of change of data value in the first page during a second preset time, wherein the magic bit is a bit that belongs to the bits of the first page and that has a frequently changed data value while data of the first page is by plural times changed and stored, divide the first page into a first partial page and a second partial page, wherein the first partial page includes the magic bit, and the second partial page excludes the magic bit, change an original value of the magic bit to a specific value, generate meta data indicating the changed original value of the magic bit, compress the first partial page in which the original value of the magic bit among bits of the first page is changed to the specific value, compress the second partial page, after compressing the first partial page and the second partial page, identify whether first data including the specific value is identical to second data included in a compressed second page stored in a memory, and store, in case that the first data is identical with the second data, the compressed first page and the meta data in the memory, by merging the compressed first partial page and the second partial page into the compressed second page, wherein an index of the meta data is mapped to an address of the compressed first page, and wherein the index of the meta data includes the original value corresponding to the specific value or an address of an area where the original value is stored.

6. The electronic device of claim 5, wherein the controller is further configured to map the address of the compressed first page to an address of the compressed second page in the memory.

7. The electronic device of claim 6, wherein the controller is further configured to generate the first data by changing a preset number of specific bits of original data included in the first page into the specific value.

8. The electronic device of claim 7, wherein the specific bits are included in a predetermined location in the first page, and wherein the predetermined location is determined based on data included in a page.

9. The method of claim 1, wherein the method further comprises identifying the first page to be compressed before the first page is compressed, and wherein the merging is initiated based on at least one of a preset time elapsing from a last use of the first page or in response to a user command.

\* \* \* \* \*